(12) United States Patent
Walitzki

(10) Patent No.: US 8,816,192 B1
(45) Date of Patent: Aug. 26, 2014

(54) THIN FILM SOLAR CELL

(75) Inventor: Hans Juergen Walitzki, Portland, OR (US)

(73) Assignee: Borealis Technical Limited (GI)

( * ) Notice: Subject to any disclaimer, the term of this patent is extended or adjusted under 35 U.S.C. 154(b) by 1029 days.

(21) Appl. No.: 12/069,615

(22) Filed: Feb. 11, 2008

Related U.S. Application Data

(60) Provisional application No. 60/900,602, filed on Feb. 9, 2007.

(51) Int. Cl.
H01L 31/00 (2006.01)

(52) U.S. Cl.
USPC ........... 136/256; 136/253; 136/255; 136/260; 136/261; 136/262; 136/264; 136/265

(58) Field of Classification Search
USPC ........................ 136/256, 253, 255, 260–265
See application file for complete search history.

(56) References Cited

U.S. PATENT DOCUMENTS

| | | | |
|---|---|---|---|
| 2,510,397 A | 6/1950 | Hansell |
| 2,915,652 A | 12/1959 | Hatsopoulos |
| 3,021,472 A | 2/1962 | Hernqvist |
| 3,118,107 A | 1/1964 | Gabor |
| 3,169,200 A | 2/1965 | Huffman |
| 3,173,032 A | 3/1965 | Maynard |
| 3,194,989 A | 7/1965 | Garbuny |
| 3,238,395 A | 3/1966 | Sense |
| 3,239,745 A | 3/1966 | Hernqvist |
| 3,267,307 A | 8/1966 | Fox |
| 3,267,308 A | 8/1966 | Hernqvist |
| 3,281,372 A | 10/1966 | Haas |
| 3,300,660 A | 1/1967 | Bensimon |
| 3,328,611 A | 6/1967 | Davis |
| 3,376,437 A | 4/1968 | Meyerand, Jr. |
| 3,393,330 A | 7/1968 | Vary |
| 3,470,393 A | 9/1969 | Moncorge |
| 3,515,908 A | 6/1970 | Caldwell |
| 3,519,854 A | 7/1970 | Davis |

(Continued)

FOREIGN PATENT DOCUMENTS

| | | |
|---|---|---|
| DE | 3404137 A1 | 8/1985 |
| DE | 3818192 A1 | 12/1989 |

(Continued)

OTHER PUBLICATIONS

Chakrabarti et al., "Photoconductivity of Cu(In,Ga)Se2 films", Solar Energy Materials, 1996.*

(Continued)

*Primary Examiner* — Matthew Martin

(57) ABSTRACT

An improved efficiency thin film solar cell is disclosed. Nanoscale indentations or protrusions are formed on the cross sectional surface of a carrier layer, onto which a thin metal film is deposited. Additional layers, including semiconductor absorber and collector layers and a window layer, are disposed on the metal film, thereby completing the solar cell. The nanostructure underlying the metal film serves to reduce the work function of the metal and thereby assists in the absorption of holes created by solar photons. This leads to more efficient electricity generation in the solar cell. In a further embodiment of the present invention the cross sectional surface of the semiconductor absorber layer is also modified by nanoscale indentations or protrusions. These indentations or protrusions have the effect of altering the size of the semiconductor band gap, thereby optimizing the radiation absorption properties of the solar cell.

12 Claims, 3 Drawing Sheets

(56) References Cited

U.S. PATENT DOCUMENTS

| | | |
|---|---|---|
| 3,578,992 A | 5/1971 | Shimada |
| 3,600,933 A | 8/1971 | Johnston |
| 3,740,592 A | 6/1973 | Engdahl et al. |
| 3,821,462 A | 6/1974 | Kaufman et al. |
| 3,843,896 A | 10/1974 | Rason et al. |
| 4,004,210 A | 1/1977 | Yater |
| 4,011,582 A | 3/1977 | Cline et al. |
| 4,039,352 A | 8/1977 | Marinescu |
| 4,063,965 A | 12/1977 | Cline et al. |
| 4,188,571 A | 2/1980 | Brunson |
| 4,224,461 A | 9/1980 | Snyder, Jr. et al. |
| 4,281,280 A | 7/1981 | Richards |
| 4,373,142 A | 2/1983 | Morris |
| 4,410,951 A | 10/1983 | Nakamura et al. |
| 4,423,347 A | 12/1983 | Kleinschmidt et al. |
| 4,667,126 A | 5/1987 | Fitzpatrick |
| 4,686,162 A | 8/1987 | Stangl et al. |
| 4,880,975 A | 11/1989 | Nishioka et al. |
| 4,928,030 A | 5/1990 | Culp |
| 4,937,489 A | 6/1990 | Hattori |
| 4,958,201 A | 9/1990 | Mimura |
| 5,023,671 A | 6/1991 | DiVincenzo et al. |
| 5,028,835 A | 7/1991 | Fitzpatrick |
| 5,049,775 A | 9/1991 | Smits |
| 5,068,535 A | 11/1991 | Rabalais |
| 5,083,056 A | 1/1992 | Kondou et al. |
| 5,119,151 A | 6/1992 | Onda |
| 5,229,320 A | 7/1993 | Ugajin |
| 5,233,205 A | 8/1993 | Usagawa et al. |
| 5,247,223 A | 9/1993 | Mori et al. |
| 5,307,311 A | 4/1994 | Sliwa, Jr. |
| 5,309,056 A | 5/1994 | Culp |
| 5,327,038 A | 7/1994 | Culp |
| 5,332,952 A | 7/1994 | Ugajin et al. |
| 5,336,547 A | 8/1994 | Kawakita et al. |
| 5,351,412 A | 10/1994 | Furuhata |
| 5,356,484 A | 10/1994 | Yater |
| 5,371,388 A | 12/1994 | Oda |
| 5,399,930 A | 3/1995 | Culp |
| 5,410,166 A | 4/1995 | Kennel |
| 5,430,409 A | 7/1995 | Buck et al. |
| 5,432,362 A | 7/1995 | Lippens et al. |
| 5,465,021 A | 11/1995 | Visscher et al. |
| 5,487,790 A | 1/1996 | Yasuda |
| 5,498,904 A * | 3/1996 | Harata et al. ............... 257/623 |
| 5,503,963 A | 4/1996 | Bifano |
| 5,504,388 A | 4/1996 | Kimura et al. |
| 5,521,735 A | 5/1996 | Shimizu et al. |
| 5,579,232 A | 11/1996 | Tong et al. |
| 5,592,042 A | 1/1997 | Takuchi |
| 5,604,357 A | 2/1997 | Hori |
| 5,654,557 A | 8/1997 | Taneya et al. |
| 5,675,972 A | 10/1997 | Edelson |
| 5,699,668 A | 12/1997 | Cox |
| 5,701,043 A | 12/1997 | Razzaghi |
| 5,705,321 A | 1/1998 | Brueck et al. |
| 5,719,407 A | 2/1998 | Ugajin |
| 5,722,242 A | 3/1998 | Edelson |
| 5,772,905 A | 6/1998 | Chou |
| 5,810,980 A | 9/1998 | Edelson |
| 5,874,039 A | 2/1999 | Edelson |
| 5,917,156 A | 6/1999 | Nobori et al. |
| 5,939,872 A | 8/1999 | Dubos et al. |
| 5,973,259 A | 10/1999 | Edelson |
| 5,981,071 A | 11/1999 | Cox |
| 5,981,866 A | 11/1999 | Edelson |
| 5,994,638 A | 11/1999 | Edelson |
| 6,064,137 A | 5/2000 | Cox |
| 6,084,173 A | 7/2000 | DiMatteo |
| 6,089,311 A | 7/2000 | Edelson |
| 6,117,344 A | 9/2000 | Cox et al. |
| 6,214,651 B1 | 4/2001 | Cox |
| 6,225,205 B1 | 5/2001 | Kinoshita |
| 6,232,546 B1 | 5/2001 | DiMatteo et al. |
| 6,281,514 B1 | 8/2001 | Tavkhelidze |
| 6,309,580 B1 | 10/2001 | Chou |
| 6,310,281 B1 * | 10/2001 | Wendt et al. ............... 136/256 |
| 6,417,060 B2 | 7/2002 | Tavkhelidze et al. |
| 6,489,704 B1 | 12/2002 | Kucherov et al. |
| 6,495,843 B1 * | 12/2002 | Tavkelidze ............... 250/493.1 |
| 6,531,703 B1 | 3/2003 | Tavkhelidze et al. |
| 6,680,214 B1 | 1/2004 | Tavkhelidze et al. |
| 6,720,704 B1 | 4/2004 | Tavkhelidze et al. |
| 6,774,003 B2 | 8/2004 | Tavkhelidze et al. |
| 6,869,855 B1 | 3/2005 | Tavkhelidze et al. |
| 6,876,123 B2 | 4/2005 | Marinovsky et al. |
| 6,908,861 B2 | 6/2005 | Sreenivasan et al. |
| 6,914,312 B2 | 7/2005 | Nishikawa et al. |
| 6,919,605 B2 | 7/2005 | Tigelaar |
| 6,919,608 B2 | 7/2005 | Gregg |
| 6,975,060 B2 | 12/2005 | Styblo et al. |
| 7,074,498 B2 | 7/2006 | Tavkhelidze et al. |
| 7,122,398 B1 * | 10/2006 | Pichler ............... 438/66 |
| 7,166,786 B2 | 1/2007 | Tavkhelidze et al. |
| 7,169,006 B2 | 1/2007 | Tavkhelidze et al. |
| 7,211,891 B2 | 5/2007 | Shimogishi et al. |
| 7,253,549 B2 | 8/2007 | Tavkhelidze et al. |
| 2001/0046749 A1 | 11/2001 | Tavkhelidze et al. |
| 2002/0170172 A1 | 11/2002 | Tavkhelidze et al. |
| 2003/0042819 A1 | 3/2003 | Martinovsky et al. |
| 2003/0068431 A1 | 4/2003 | Taliashvili et al. |
| 2003/0127127 A1 * | 7/2003 | Inamasu et al. ............... 136/255 |
| 2003/0152815 A1 | 8/2003 | LaFollette et al. |
| 2003/0221608 A1 | 12/2003 | Mori |
| 2004/0029341 A1 | 2/2004 | Cox et al. |
| 2004/0174596 A1 | 9/2004 | Umeki |
| 2004/0195934 A1 | 10/2004 | Tanielian |
| 2004/0206881 A1 | 10/2004 | Tavkhelidze et al. |
| 2005/0074915 A1 * | 4/2005 | Tuttle et al. ............... 438/57 |
| 2005/0104512 A1 | 5/2005 | Tavkhelidze et al. |
| 2005/0109392 A1 * | 5/2005 | Hollars ............... 136/265 |
| 2005/0110099 A1 | 5/2005 | Shimogishi et al. |
| 2005/0145836 A1 | 7/2005 | Tavkhelidze et al. |
| 2007/0056623 A1 | 3/2007 | Tavkhelidze et al. |

FOREIGN PATENT DOCUMENTS

| | | |
|---|---|---|
| DE | 4025618 A1 | 2/1992 |
| EP | 0437654 A1 | 7/1991 |
| JP | 07322659 A | 12/1995 |
| WO | WO-97/02460 A1 | 1/1997 |
| WO | WO-99/10974 A1 | 3/1999 |
| WO | WO-99/13562 A1 | 3/1999 |
| WO | WO-99/64642 A1 | 12/1999 |
| WO | WO-00/59047 A1 | 10/2000 |
| WO | WO-02/47178 A2 | 6/2002 |
| WO | WO-03/021758 A2 | 3/2003 |
| WO | WO-03/083177 A3 | 10/2003 |
| WO | WO-03/090245 A1 | 10/2003 |
| WO | WO-2004/040617 A2 | 5/2004 |
| WO | WO-2006/055890 A2 | 5/2006 |

OTHER PUBLICATIONS

Krc et al., Optical and electrical modeling of Cu(In,Ga)Se2 solar cells, Optical and Quantum Electronics, 2006.*

Bardeen et al., "Theory of Superconductivity", Physical Review, Dec. 1, 1957, pp. 1175-1204, vol. 108, No. 5.

Chou et al., "Imprint Lithography with 25 Nanometer Resolution", Science, Apr. 5, 1996, pp. 85-87, vol. 272.

Hishinuma et al., "Refrigeration by combined tunneling and thermionic emmission in vacuum: Use of nanometer scale design", Appl Phys Lett, Apr. 23, 2001, pp. 2572-2574,vol. 78,No. 17.

Leon N. Cooper, "Bound Electron Pairs in Degenerate Fermi Gas", Physical Review, Nov. 15, 1956, pp. 1189-1190, vol. 104, No. 4.

Sungtaek Ju et al., "Study of interface effects in thermoelectric microfefrigerators", Journal of Applied Physics, Oct. 1, 2000, pp. 4135-4139, vol. 88, No. 7.

Tavkhelidze et. al, "Observation of New Quantum Interference Effect in Solids", Vacuum Nanoelectronics Conference, 2005. IVNC 2005. Technical Digest of the 18th International, Jul. 10-14, 2005, pp. 11-12.

(56) References Cited

OTHER PUBLICATIONS

Tavkhelidze et. al, "Observation of quantum interference effect in solids", Journal of Vacuum Science & Technology B: Microelectronics and Nanometer Structures, May 12, 2006, pp. 1413-1416, vol. 24, Issue 3.

Fitzpatrick, Gary et al., "Demonstration of Close-Spaced Thermionic Converters", Proceedings of the 28th Intersociety Energy Conversion Engineering Conference, May 1993, pp. 1.573-1.580, vol. 1, American Chemical Society, Washington, DC, USA.

Fitzpatrick, Gary O. et al., "Close-Spaced Thermionic Converters with Active Spacing Control and Heat-Pipe Isothermal Emitters", Proceedings of the 31st Intersociety Energy Conversion Engineering Conference, Aug. 11, 1996, pp. 920-927, vol. 2, IEEE, USA.

Fitzpatrick, Gary O. et al., "Updated perspective on the potential for thermionic conversion to meet 21st century energy needs", IECEC '97, Proceedings of the 32nd Intersociety Energy Conversion Engineering Conference, Energy Systems, Renewable Energy Resources, Environmental Impact and Policy Impacts on Energy, Jul. 27, 1997, pp. 1045-1051, vol. 2, IEEE, USA.

Fukuda, Ryuzo et al., "Development of the Oxygenated Thermionic Energy Converters Utilizing the Sputtered Metal Oxides as a Collector", Space Technology and Applications International Forum—1999, AIP Conference Proceedings, Subseries: Astronomy and Astrophysics, Jan. 22, 1999, pp. 1444-1451, vol. 458, American Institute of Physics, USA.

Abstract of JP 05226704 A, Matsushita Electric Ind Co Ltd, Sep. 3, 1993, "Thermoelectric Device and its Manufacture".

Hatsopoulos, George N. et al., "Thermionic Energy Conversion—vol. I: Process and Devices", Mar. 15, 1974, p. 222, The MIT Press, USA.

Houston. J.M., "Theoretical Efficiency of the Thermionic Energy Converter", Journal of Apllied Physics, Sep. 17, 1959, pp. 481-487, vol. 30, No. 4, American Institute of Physics, New York.

Huffman, Fred N. et al., "Preliminary Investigation of a Thermotunnel Converter", 1988 IECEC; Proceedings of the Twenty-third Intersociety Energy Conversion Engineering Conference, Aug. 1988, pp. 573-579, vol. 1, American Society of Mechanical Engineers, New York.

Kalandarishvili, Arnold G., "The basics of the technology of creating a small interelectrode spacing in thermionic energy converters with the use of two-phase systems", IECEC '97, Proceedings of the 32nd Intersociety Energy Conversion Engineering Conference, Energy Systems, Renewable Energy Resources, Environmental Impact and Policy Impacts on Energy, Jul. 27, 1997, pp. 1052-1056, vol. 2, IEEE, USA.

King, Donald B. et al., "Results from the Microminiature Thermionic Converter Demonstration Testing Program", Space Technology and Applications International Forum—1999, Jan. 22, 1999, pp. 1432-1436, vol. 458, American Institute of Physics, USA.

Mahan, G.D., "Thermionic Refrigeration", Journal of Applied Physics, Oct. 1, 1994, pp. 4362-4366, vol. 76, Issue 7, American Institue of Physics, USA.

Shakouri, Ali et al., "Enhanced Thermionic Emission Cooling in High Barrier Superlattice Hetero-structures", Materials Research Society Symposium Proceedings, Mar. 1999, pp. 449-458, vol. 545, Materials Research Society, Warrendale, Pennsylvania.

Svensson, Robert et al., "TEC as Electric Generator in an Automobile Catalytic Converter", Proceedings of the 31st Intersociety Energy Conversion Engineering Conference, Aug. 1996, pp. 941-944, vol. 2, IEEE, USA.

Zeng, Taofang et al., "Hot Electron Effects on Thermionic Emission Cooling in Heterostructures", Materials Research Society Symposium Proceedings, Mar. 1999, pp. 467-472, vol. 545, Materials Research Society, Warrendale, Pennsylvania.

Abstract of SU 861916 B, Burmistrov, Sep. 10, 1981, "Electro-hydrodynamic heat pipe—has needle electrodes situated on wall in condensation zone".

Abstract of JP 404080964 A, ANDO, Mar. 13, 1992, "Semiconductor device".

Abstract of JP 03155376 A, Japan Tom Power Co Ltd, Jul. 3, 1991, "Thermoelectric Generating Element".

* cited by examiner

THIN FILM SOLAR CELL

CROSS-REFERENCE TO RELATED APPLICATIONS

This application claims the benefit of U.S. Provisional Patent Application No. 60/900,602, filed Feb. 9, 2007.

BACKGROUND OF THE INVENTION

The present invention relates to thin film solar cells.

A) Increasing Emission Through a Potential Barrier by Altering the Surface Structure of the Potential Barrier.

In U.S. Pat. No. 6,680,214 and U.S. Pat. App. No. 2004/0206881 methods are disclosed for the induction of a suitable band gap and electron emissive properties into a substance, in which the substrate is provided with a surface structure corresponding to the interference of electron waves.

The space distribution of the probability wave associated with an elementary particle is given by:

$$\psi^* = A\exp(ikr) \quad (1)$$

where k is the wave number and r is a vector connecting initial and final locations of the particle.

FIG. 1 shows incident wave 101 Aexp(ikx) moving from left to right perpendicular to a surface dividing two domains. The surface is associated with a potential barrier.

Incident wave 101 Aexp(ikx) will mainly reflect back as reflected wave 103 βAexp(−ikx), and only a small part leaks through the surface to give transmitted wave 102 α(x)Aexp(ikx) (β≈1>>α). This is known as quantum mechanical tunneling. The elementary particle will pass the potential energy barrier with a low probability, depending on the potential energy barrier height.

In U.S. Pat. Nos. 6,531,703, 6,495,843 and 6,281,514, Tavkhelidze teaches a method for promoting the passage of elementary particles at or through a potential barrier comprising providing a potential barrier having a geometrical shape for causing de Broglie interference between said elementary particles.

Referring to FIG. 2, two domains are separated by a surface 201 having an indented shape, with height a. An incident probability wave 202 is reflected from surface 201 to give two reflected waves. Wave 203 is reflected from top of the indent and wave 204 is reflected from the bottom of the indent.

For certain values of a, the reflected probability wave equals zero meaning that the particle will not reflect back from surface 201. Leakage of the probability wave through the barrier will occur with increased probability.

Indents on the surface should have dimensions comparable to the de Broglie wavelength of an electron in order for this effect to be seen. Indents of these dimensions may be constructed on a surface by a number of means known in the art such as micro-machining. Alternatively, the indented shape may be introduced by depositing a series of islands on the surface.

For metals, this approach has a two-fold benefit. In the case that the potential barrier does not allow tunneling, providing indents on a surface of a metal creates for that metal an energy band gap due to de Broglie wave interference inside the metal. In the case that the potential barrier is of such a type that an electron can tunnel through it, providing indents on a metal surface decreases the effective potential barrier between metal and vacuum (the work function). In addition, an electron moving from vacuum into an anode electrode having an indented surface will also experience de Broglie interference, which will promote the movement of said electron into said electrode, thereby increasing the performance of the anode.

WO03083177 teaches that a metal surface can be modified with patterned indents to increase the Fermi energy level inside the metal, leading to decrease in electron work function. This effect would exist in any quantum system comprising fermions inside a potential energy box.

This approach can also be applied to semiconductors, in which case providing indents on the surface of a semiconductor modifies the size of the already present bandgap. This approach has many applications, including applications usually reserved for quantum dots.

In U.S. Pat. No. 6,117,344 methods for fabricating nanostructured surfaces having geometries in which the passage of elementary particles through a potential barrier is enhanced are described. The methods use combinations of electron beam lithography, lift-off, and rolling, imprinting or stamping processes.

WO9964642 discloses a method for fabricating nanostructures directly in a material film, preferably a metal film, deposited on a substrate. In a preferred embodiment a mold or stamp having a surface which is the topological opposite of the nanostructure to be created is pressed into a heated metal coated on a substrate. The film is cooled and the mold is removed. In another embodiment, the thin layer of metal remaining attached to the substrate is removed using bombardment with a charged particle beam.

B) Thin Film Solar Cells

Thin film solar cells made from Copper Indium Gallium Diselenide (CIGS) absorbers show great promise in achieving high conversion efficiencies, approaching 20%. The highest recorded efficiency of CIGS solar cells is by far the greatest compared with those achieved by other thin film technologies such as Cadmium Telluride (CdTe) or amorphous Silicon (a-Si).

CIGS solar cells contain several thin layers of an active material which is deposited onto an inexpensive carrier. While initially glass sheets were used as carriers, recent developments include metal foils, such as stainless steel and even polymer foils. On glass or polymers, the first layer deposited is a thin metal film serving as a back contact. Then, a semiconductor diode is formed by a combination of a CIGS (p-type) absorber with a top collector layer of CdS (n-type). Finally, a Zinc Oxide (ZnO) film and Aluminum (Al) grid are provided for the top layers and electrical contacts respectively.

FIG. 3 illustrates the basic structure of prior art CIGS solar cell 300. Shown is solar cell 300 with a layered structure comprising ZnO window layer 301, CdS collector layer 303, CIGS absorber layer 305 and metal back contact 307. Electrical connectors 309 contact the two outermost layers of solar cell 300 and are connected to electrical device 311 which is powered by the electricity generated by solar cell 300.

Photons enter solar cell 300 via ZnO window layer 301. Absorber layer 305 absorbs photons and ejects electrons thus creating pairs of electrons 313 and holes 315. Collector layer 303 is an n-type semiconductor layer in electrical contact with absorber layer 305. This layer collects electrons 313 from absorber layer 305.

The separation of electron 313-hole 315 pair is maintained by the local electrical field formed at the p-n junction between absorber layer 305 and collector layer 303. Electron 313 moves towards aluminum contacts (not shown) on the surface of ZnO window 301 while hole 315 moves towards metal back contact 307; their movement is illustrated by the arrows shown. An electrical current is thus formed, which flows through electrical connectors 309. This current can be harnessed to power electrical load 311.

The typical thin film solar cell described has several disadvantages, the major one being its low efficiency. The cell's low efficiency is due to numerous factors, several of which are outlined below:

Only those photons with energies equal to or greater than the band gap of the absorber can be absorbed to produce electricity. The majority of photons, with energies outside of this range, is either reflected or passes straight through the solar cell. The efficiency of the solar cell is thus severely limited. Attempts at controlling the band gap of the absorber by the introduction of quantum dots are currently challenged by inefficient charge carrier transport mechanisms outside the quantum dots.

Potential power is also lost when electrons and holes combine between the p-n junction and back contact, thereby generating heat rather than electricity. This mechanism is the cause of collection losses and further reduces the efficiency of thin film solar cells.

Furthermore, a natural resistance exists between the inner, sandwiched cell layers and the outer electrical contact layers in contact with the external circuit. This resistance tends to impede current flow through the external circuit, thus further diminishing the power output of the device.

Due to the low power output, operating a solar cell is relatively expensive. A modest estimate of operating costs is in the region of $3/watt. This makes the solar cell a poor competitor in the energy generation market.

From the foregoing it may be appreciated that a need has arisen for a thin film solar cell with improved efficiency, capable of responding to a broader range of photon energies and with suppressed loss mechanisms and lower operating costs.

BRIEF SUMMARY OF THE INVENTION

The present invention discloses a thin film solar cell containing a modified metal back contact. The cross sectional surface of a carrier layer is modified by nanoscale indentations or protrusions. A metal film is then deposited onto the carrier layer to form the back contact of the solar cell. The indentations or protrusions on the surface of the carrier layer are of dimensions so as to reduce the work function of the metal and thereby assist in the absorption of holes created by solar photons by the emission of electrons.

Further layers, including semiconductor absorber and collector layers and a window layer, are deposited above the metal contact to form a solar cell.

An advantage of the present invention is that since the modified structure of the metal reduces its work function, electrons are emitted from the metal surface at lower energies and can readily combine with holes, created by solar photons, to produce electricity. This improves the efficiency of the solar cell since a greater energy output is produced by a lower energy input.

A further advantage of the present invention is that the natural resistance present between the metal back contact and the semiconductor layer above it is reduced. Current losses at the back contact are therefore minimised, increasing the output current of the device.

Yet a further advantage of the present invention is the reduction in collection losses, which are caused by delayed recombination of electrons and holes between the p-n junction of the solar cell and the metal back contact. The reduced work function of the metal allows electrons and holes to combine more quickly and at lower energies, leading the generation of useful electricity rather than wasted heat.

A further advantage of the present invention is that it can be readily manufactured using inexpensive materials.

In a further embodiment of the present invention the semiconductor absorber layer, disposed on the surface of the metal back contact, is also modified with nanoscale indentations or protrusions. These have the effect of changing the size of the band gap in the semiconductor and thus altering the absorption properties of the solar cell.

An advantage of this embodiment of the present invention is that, due to the modification of the semiconductor absorber layer, the size of the band gap in the semiconductor is tuned. An optimum band gap, facilitating maximum possible solar-electric energy conversion, can thus be selected and the sensitivity of the solar cell extended to include lower energy photons.

A further advantage of the present invention is that the band gap of the semiconductor absorber layer can be tuned so as to optimize absorption of light based on specific local geographical requirements.

A further advantage of the present invention is that the structure of the carrier layer—when replicated on the front surface—reduces the reflection of photons and thereby increases the amount of energy absorbed.

An overall advantage of the present invention, due to the contributing advantages outlined so far, is that its operating cost is lower due to its improved efficiency.

Still further advantages will become apparent from a consideration of the ensuing description and drawings.

BRIEF DESCRIPTION OF THE SEVERAL VIEWS OF THE DRAWING

Embodiments of the present invention will now be described with reference to appropriate figures, which are given by way of example only and are not intended to limit the present invention.

For a more complete explanation of the present invention and the technical advantages thereof, reference is now made to the following description and the accompanying drawings in which.

DETAILED DESCRIPTION OF THE INVENTION

Figure 1:
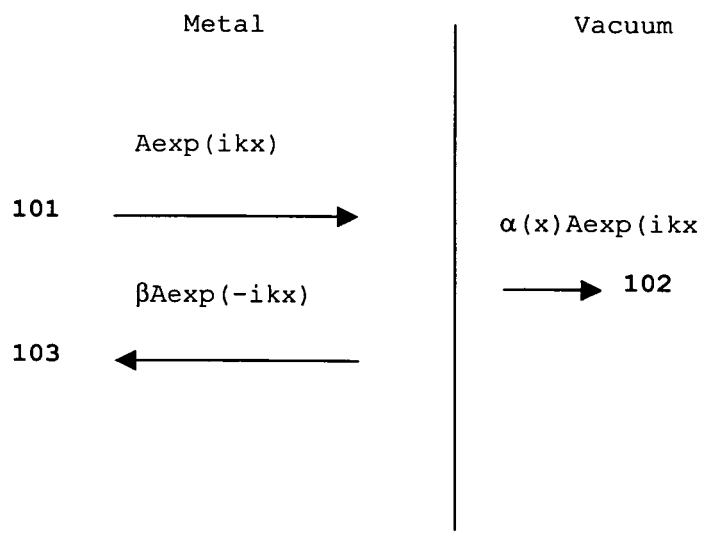
FIG. 1 illustrates an incident probability wave, reflected probability wave and transmitted probability wave.
Figure 2:
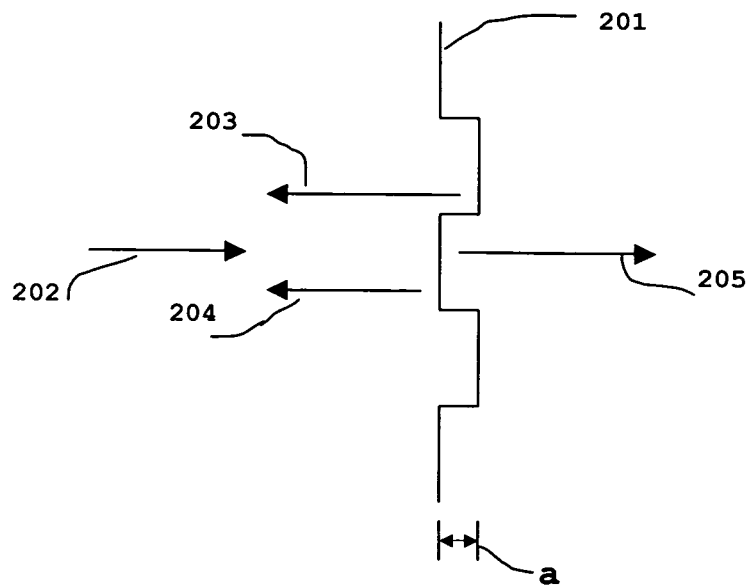
FIG. 2 illustrates an incident probability wave, two reflected probability waves and a transmitted probability wave interacting with a surface having a series of indents or protrusions.
Figure 3:
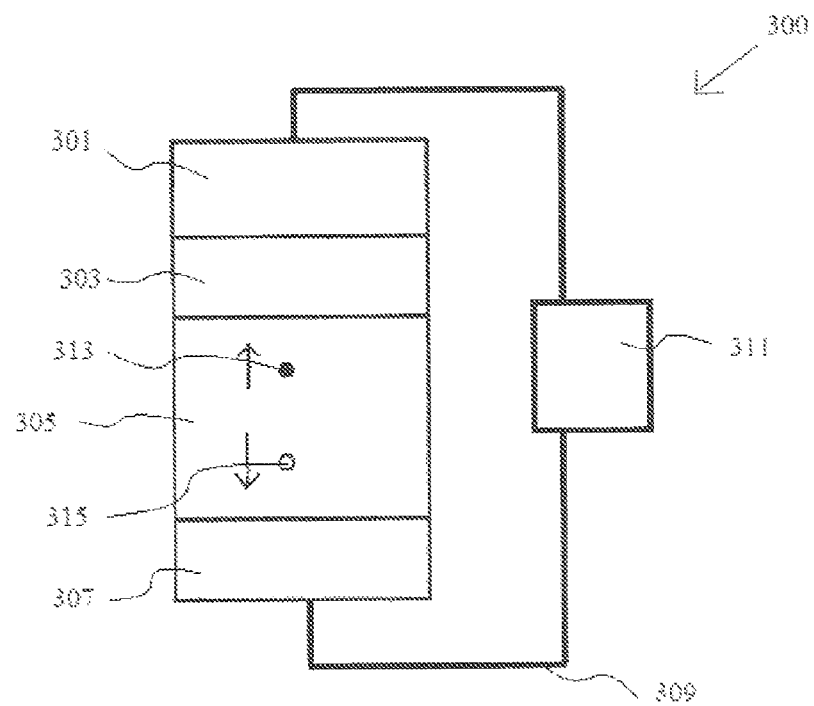
FIG. 3 shows, in diagrammatic form, the structure of a prior art thin film solar cell.
Figure 4:
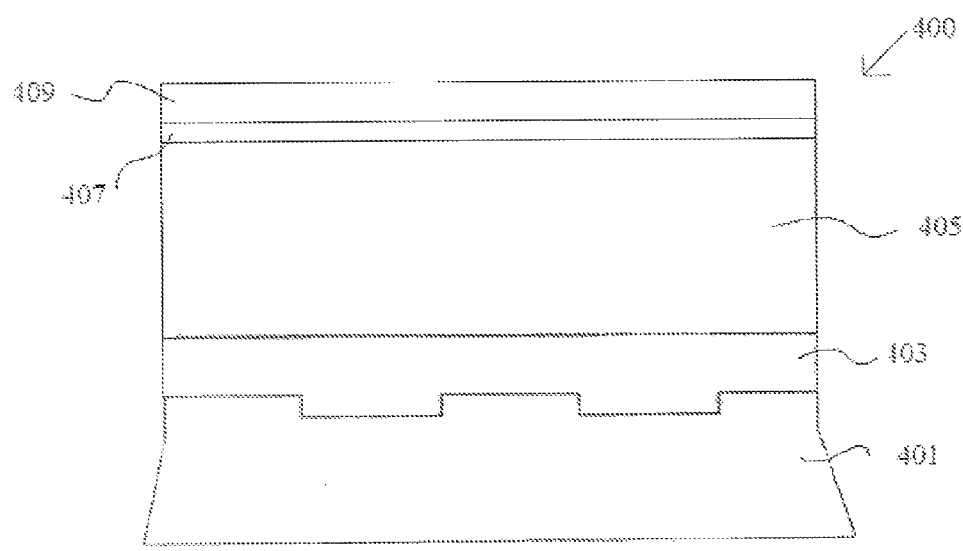
FIG. 4 shows a cross sectional view of the thin film solar cell of the present invention.
Figure 5:
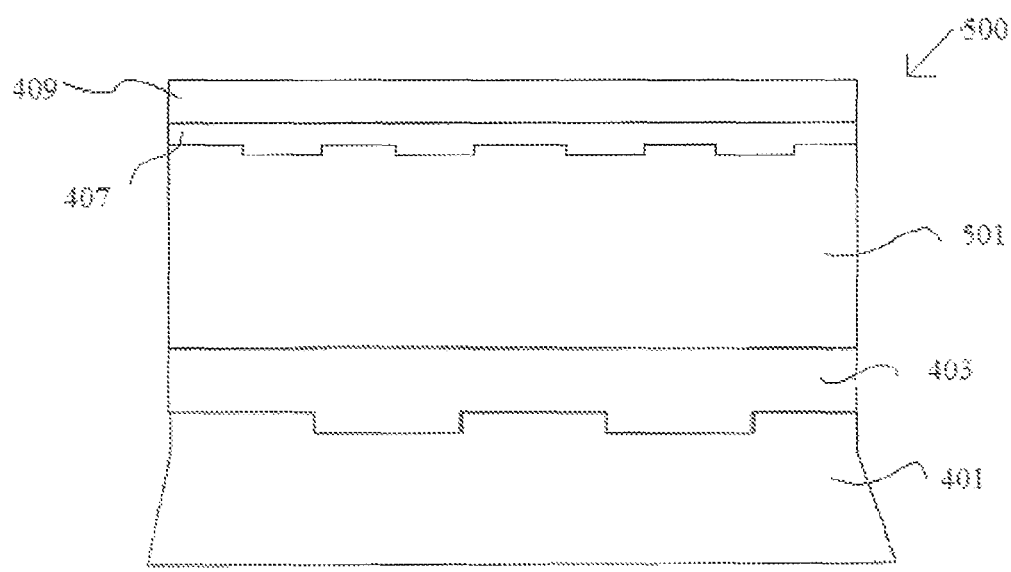
FIG. 5 shows a cross sectional view of a further embodiment of the thin film solar cell of the present invention.

The embodiments of the present invention and its technical advantages are best understood by referring to FIGS. 4-5. The present invention relates to a thin film solar cell, in which the structure of the metal back contact is modified, thereby improving the efficiency of the cell.

Referring now to FIG. 4, which shows a cross sectional view of the thin film solar cell of the present invention. Shown is solar cell 400 comprising carrier layer, 401, metal back contact, 403, p-type semiconductor absorber layer, 405, n-type semiconductor collector layer 407 and ZnO window layer 409.

The surface of carrier layer 401 is modified with nanoscale indentations or protrusions to have a periodically repeating structure of one or more indents or protrusions. Methods for carrying this out are well known to those skilled in the art and include screen printing, as used for printing CD surfaces, electron beam lithography and other imprinting processes. In a preferred embodiment of the present invention the indents or protrusions are of a depth less than approximately 10 nm and a width less than approximately 1 μm. In further possible embodiments of the present invention the indents or protrusions are of a depth approximately equal to 5 nm and a width less than approximately 100 nm.

A thin film of metal is deposited on carrier layer 401 forming metal back contact 403. This deposition can be carried out using a variety of methods, well known to those skilled in the art, including sputtering and physical vapor deposition. All other overlying films—405, 407 and 409—are deposited by methods known in the art including a combination of "ink-jet" printing the individual components followed by thermal annealing.

Incoming solar photons enter solar cell 400 via Zinc Oxide (ZnO) window layer 409. These photons undergo reflection, transmission or absorption depending on their individual energies relative to the size of the band gap in absorber layer 405. Photons with energies smaller than the band gap cannot be absorbed by the solar cell and are either reflected from the surface or pass straight through the device. Photons with energies equal to or greater than the band gap are absorbed and excite electrons from the valence to conduction band in absorber layer 405, thus creating electron-hole pairs.

Due to the intrinsic voltage differential across the absorber-collector p-n junction, the electrons and holes separate and move towards collector layer 407 or within absorber layer 405 respectively. Electrons in collector layer 407 arrive at an aluminum grid electrical contact (not shown) on the surface of window layer 409. Holes in absorber layer 405 arrive at metal back contact 403. The nanostructure underlying metal back contact 403 serves to reduce its work function and therefore assists in the absorption of holes. Electrons from the metal back contact readily combine with the holes to produce a current at metal back contact 403.

In a particularly preferred embodiment of the present invention, absorber layer 405 is made of Copper Indium Gallium Diselenide (CIGS), a p-type semiconductor, and is substantially 2-3 μm thick.

In a preferred embodiment of the present invention, collector layer 407 is made of Cadmium Sulphide (CdS), an n-type semiconductor and is substantially equal to 0.1 μm thick.

In yet another preferred embodiment of the present invention printed carrier layer 401 is a polyimide film with thickness substantially greater than 100 μm.

In a preferred embodiment of the present invention metal back contact 403 is Molybdenum and is substantially 0.5 μm thick. In further possible embodiments of the invention, metal back contact 403 is made of a choice of metals including Copper, Nickel and Aluminium.

In a further possible embodiment of the present invention the surface structure of carrier layer 401 is replicated on the front side of solar cell 400, namely the side of solar cell 400 that faces the sun. The surface structure acts as an anti-reflective coating due to interference effects, thereby optimizing the absorption of incoming solar photons.

Referring now to FIG. 5 which shows a cross sectional view of a further possible embodiment of the thin film solar cell of the present invention.

Shown is solar cell 500 comprising carrier layer, 401, metal back contact, 403, p-type semiconductor absorber layer, 501, n-type semiconductor collector layer 407 and ZnO window layer 409.

Whereas in the previous embodiment of the present invention shown in FIG. 4 disclosed above, only the surface structure of carrier layer 401 was modified with periodically repeating indents and protrusions, in the embodiment of the present invention shown in FIG. 5 the surface of semiconductor absorber layer 501 is also modified with nanoscale periodically repeating indentations or protrusions. The theory and details pertaining to the structure of these indentations or protrusions are as described above in relation to the periodically repeating indentations or protrusions on the surface of carrier layer 401. The dimensions of the indentations or protrusions are such as to modify the size of the band gap in semiconductor absorber layer 501 and thereby alter the absorption properties of solar cell 500. The larger the band gap, the more energetic the photons that can be captured and the greater the output voltage of the solar cell. The smaller the band gap the larger the portion of incoming photons that can be captured and the greater the output current of the solar cell.

In a particularly preferred embodiment of the present invention, the size of the indentations or protrusions on the surface of semiconductor absorber layer 501 is chosen so as to produce the optimum band gap in the semiconductor, leading to maximum possible solar-electric energy conversion.

In a further preferred embodiment of the present invention, the band gap of semiconductor absorber layer 501 is tuned so as to extend the absorption band edge to longer wavelengths, allowing the absorption of photons in the infrared region.

In another embodiment of the present invention, the band gap is tuned based on the specific local requirements of the region where the solar cell operates so that maximum sunlight energy is absorbed.

All other structural and functional details of the embodiment of the present invention shown in FIG. 5 are as described in reference to FIG. 4.

Although the description above contains many specificities, these should not be construed as limiting the scope of the present invention but as merely providing illustrations of some of the presently preferred embodiments of the invention. Thus the scope of the present invention should be determined by the appended claims and their legal equivalents, rather than by the examples given.

The invention claimed is:

1. A thin film solar cell characterized by improved efficiency of electricity generation from solar photons comprising:
   a. a carrier layer comprising a polymer, wherein a surface of said carrier layer comprises periodically repeating indents and protrusions, each said indent having a depth of 5 nm and a width of less than approximately 100 nm;
   b. a metal back contact layer deposited on the periodically repeating indents and protrusions on said carrier layer surface, wherein a surface of said metal contact back layer in contact with said carrier layer surface comprises periodically repeating indents and protrusions located and sized to correspond to said periodically repeating indents and protrusions on said carrier surface layer, said periodically repeating indents and protrusions being configured to reduce work function;
   c. a p-type semiconductor absorber layer comprising Copper Indium Gallium Diselenide disposed on a surface of said metal back contact layer opposite said metal back contact layer surface with indents, wherein said p-type semiconductor absorber layer includes a band gap;

d. an n-type semiconductor collector layer disposed on a surface of said p-type semiconductor absorber layer not in contact with said metal back contact layer to form a p-n junction with a voltage differential;

e. a window layer comprising zinc oxide (ZnO) disposed on a surface of said n-type semiconductor collector layer opposite said p-n junction; and f. an electrical contact comprising an aluminum grid positioned on a surface of aid window layer to receive electrons from said n-type semiconductor collector layer.

2. The solar cell of claim 1, wherein said carrier layer comprises a polyimide with a thickness greater than 100 micrometers.

3. The solar cell of claim 1, wherein said metal back contact layer comprises one or a combination of Molybdenum, Copper, Silver, Nickel or other metals with good electrical conductivity and has a thickness equal to 0.5 micrometers.

4. The solar cell of claim 1, wherein said p-type semiconductor absorber layer has a thickness in the range of 2-3 micrometers.

5. The solar cell of claim 1, wherein said n-type semiconductor collector layer comprises Cadmium Sulfide and has a thickness equal to 0.1 micrometers.

6. The solar cell of claim 1, further comprising electrical connectors connected to said metal back contact layer and said electrical contact, whereby an electrical current travels therebetween.

7. The solar cell of claim 1, wherein the surface of said p-type semiconductor absorber layer in contact with said n-type semiconductor collector layer at said p-n junction comprises periodically repeating indents and protrusions, said indents having a depth of 5 nm and a width of less than 100 nm, and wherein the depth and width of said indents is selected so that the band gap in said p-type semiconductor absorber layer has a dimension sized to maximize efficiency of the solar cell.

8. The solar cell of claim 7, wherein the depth and width of said indents in said p-type semiconductor absorber layer is selected to optimize absorption of solar photons by said solar cell.

9. The solar cell of claim 1, where a surface of said solar cell facing the sun comprises periodically repeating intents and protrusions, each indent having a depth of less than 5 nm and a width of 100 nm.

10. A thin film solar cell characterized by improved efficiency of electricity generation from solar photons comprising:

a. a carrier layer comprising a polyimide having a thickness greater than 100 μm, wherein a surface of said carrier layer comprises periodically repeating indents and protrusions, each said indent having a depth of 5 nm and a width of less than 100 nm;

b. a metal back contact layer deposited on the pattern of indents and protrusions on said carrier layer surface, wherein a surface of said metal contact back layer in contact with said carrier layer has periodically repeating indents and protrusions located and sized to correspond to said periodically repeating indents and protrusions on said carrier surface layer;

c. a p-type semiconductor absorber layer comprising Copper Indium Gallium Diselenide having a band gap disposed on a surface of said metal back contact layer opposite said surface of said metal back contact layer in contact with said carrier layer, wherein a surface of said p-type semiconductor absorber layer opposite said metal back contact layer comprises periodically repeating indents and protrusions;

d. an n-type semiconductor collector layer disposed on said surface of said p-type semiconductor collector layer with said periodically repeating indents and protrusions to form a p-n junction, wherein said n-type semiconductor collector layer surface is configured to contact said p-type semiconductor absorber layer surface at said p-n junction;

e. a window layer comprising zinc oxide (ZnO) disposed on a surface of said n-type semiconductor collector layer opposite said p-n junction; and f. an electrical contact comprising an aluminum grid positioned on a surface of aid window layer to receive electrons from said n-type semiconductor collector layer.

11. The solar cell of claim 10, wherein said metal back contact layer comprises one or a combination of molybdenum, copper, silver, or nickel and has a thickness of 0.5 μm; said p-type semiconductor absorber layer and has a thickness in the range of 2-3 μm; and said n-type semiconductor collector layer comprises cadmium sulfide and has a thickness of 0.1 μm.

12. The solar cell of claim 10, wherein a depth of said indents and a width of said indents in the surface of said p-type semiconductor absorber layer at said p-n junction are selected to optimize size of the band gap in said p-type semiconductor absorber layer, thereby maximizing solar-electric energy conversion.

* * * * *